(12) United States Patent
Thiel et al.

(10) Patent No.: US 9,704,734 B2
(45) Date of Patent: Jul. 11, 2017

(54) ELECTROADHESION GRIPPER FOR RETAINING WORKPIECES

(71) Applicant: TRUMPF Werkzeugmaschinen GmbH + Co. KG, Ditzingen (DE)

(72) Inventors: Walter Thiel, Schwaikheim (DE); Alexander Heinz, Vaihingen an der Enz (DE)

(73) Assignee: TRUMPF Werkzeugmaschinen GmbH + Co. KG, Ditzingen (DE)

( * ) Notice: Subject to any disclaimer, the term of this patent is extended or adjusted under 35 U.S.C. 154(b) by 401 days.

(21) Appl. No.: 14/597,521

(22) Filed: Jan. 15, 2015

(65) Prior Publication Data

US 2015/0124369 A1    May 7, 2015

Related U.S. Application Data

(63) Continuation of application No. PCT/EP2013/002056, filed on Jul. 11, 2013.

(30) Foreign Application Priority Data

Jul. 17, 2012  (DE) .................. 10 2012 212 465

(51) Int. Cl.
  *H01L 21/683* (2006.01)
  *H02N 13/00* (2006.01)

(52) U.S. Cl.
  CPC ......... *H01L 21/6833* (2013.01); *H02N 13/00* (2013.01)

(58) Field of Classification Search
  CPC .......................... H01L 21/6833; H02N 13/00
  See application file for complete search history.

(56) References Cited

U.S. PATENT DOCUMENTS 6,781,812 B2 * 8/2004 Fuwa .................. H01L 21/6833
                                                    361/234
7,126,091 B1   10/2006 Westfall

FOREIGN PATENT DOCUMENTS

| DE | 102010040686 | | 1/2012 |
|---|---|---|---|
| GB | 1352715 | | 5/1974 |
| GB | 2354111 | A | 3/2001 |
| JP | 6244270 | A | 9/1994 |
| JP | 06244274 | A | 9/1994 |
| JP | 10284583 | A | 10/1998 |
| JP | 1140661 | A | 2/1999 |

(Continued)

OTHER PUBLICATIONS

International Search Report for PCT Application No. PCT/EP2013/002056, mailed Dec. 13, 2013, 4 pages.

*Primary Examiner* — Scott Bauer
(74) *Attorney, Agent, or Firm* — Fish & Richardson P.C.

(57) ABSTRACT

An electroadhesion gripper for retaining workpieces includes a first spiral electrode having a plurality of turns and a second spiral electrode having a plurality of turns, the two spiral electrodes being arranged so as to be at least partially bifilar. The electroadhesion gripper has a diode by which the first and second spiral electrodes are connected to each other. Portions of the first and second spiral electrodes are connected in series by the diode, and an entirety of the connected portions of the first and second spiral electrodes has a perceptible inductivity. The gripper is driven with an alternating-current (AC) voltage and an occupation state and wear degree of the gripper can be determined during the AC voltage cycle.

30 Claims, 9 Drawing Sheets

(56) References Cited

FOREIGN PATENT DOCUMENTS

| | | | |
|---|---|---|---|
| JP | 11040661 A | | 2/1999 |
| JP | 11330218 A | * | 11/1999 |
| JP | 2007019524 A | | 1/2007 |
| WO | WO0132114 A1 | | 5/2001 |
| WO | WO2008070201 A2 | | 6/2008 |

* cited by examiner

ELECTROADHESION GRIPPER FOR RETAINING WORKPIECES

CROSS-REFERENCE TO RELATED APPLICATIONS

This application is a continuation of and claims priority under 35 U.S.C. §120 to PCT Application No. PCT/EP2013/002056 filed on Jul. 11, 2013, which claimed priority to German Application No. DE 10 2012 212 465.9, filed on Jul. 17, 2012. The contents of both of these priority applications are hereby incorporated by reference in their entirety.

TECHNICAL FIELD

The invention relates to an electroadhesion gripper for retaining workpieces, particularly one comprising two spiral electrodes arranged to be at least partially bifilar.

BACKGROUND

Electroadhesion grippers are used to retain workpieces on an adhesion face (gripping face) of the gripper, for instance, for transporting the workpieces in industrial production processes, in particular linked production processes.

There are constructed on the adhesion face two electrodes, to which a voltage is applied so that there is a powerful electrical field between the electrodes. A workpiece which abuts the adhesion face remains bonded to the adhesion face when the electrical field is switched on.

GB 1352715 A (Stevko) discloses an electroadhesion gripper in which the two electrodes are constructed with mutually engaging, straight fingers. In an alternative embodiment, the electrodes are constructed as two spirals which are fitted one in the other.

Electroadhesion is suitable in particular for retaining workpieces which are light in relation to the surfaces thereof, for example, metal sheets, because the active forces (compared, for example, with suction grippers or magnetic grippers) are relatively small.

WO 2008/070201 A2 (SRI International) discloses electroadhesion devices having a deformable adhesion face, in particular as auxiliary climbing means for scaling a rough wall. In addition to rake-like electrodes, electrodes constructed from concentric rings are also mentioned. Furthermore, there is proposed a hybrid gripper having a bell-like suction member, on the periphery of which an electroadhesion device is arranged in order to reduce a leakage rate and to increase the suction forces. WO 01/32114 A1 discloses a skin gripping apparatus, in which the skin of a human acting as an electrode is connected with respect to one or more electrodes of the apparatus. In a variant, a reduced pressure is further applied to a large number of air channels as a vacuum massaging device.

In particular when electroadhesion is used alone to grip and move a workpiece and only a correspondingly small force acts on the workpiece, an examination should be carried out in linked production processes as to whether the gripping of the workpiece was successful and whether the workpiece has been lost (dropped) during the movement action. It should further be examined whether the deposit of a workpiece was successful because capacitive residual charges at the electrodes or the workpiece can also bring about a substantial residual adhesion effect after the voltage has been switched off.

In order to ensure the discharge of a workpiece, it is known to support the discharge process in the case of an electroadhesion gripper with a discharge actuator, cf. GB 2354111 A. It is further known to determine capacitive residual charges with complex circuits and to discharge them, cf. JP 2007-019524 A, JP 6244270 A, JP 10284583 A, JP 11040661 A, so that the discharge can be carried out reliably; however, this procedure is complex and difficult in practice.

DE 10 2010 040 686 B3 discloses the monitoring in a suction gripper of the occupation with a workpiece by electrical measurements. In particular, an electrical contact can be closed or a parallel current path can be opened by a gripped metal workpiece; it is also proposed to evaluate an increase in the inductivity brought about by a gripped workpiece in a conductor loop near the workpiece position.

In order to check the occupation of an electroadhesion gripper, an additional measurement current circuit could be set up, which would, however, complicate the structure of the electroadhesion gripper and make the electroadhesion gripper substantially more expensive.

SUMMARY

One aspect of the invention features an electroadhesion gripper for retaining workpieces, including a first spiral electrode having a plurality of turns and a second spiral electrode having a plurality of turns, the first and second spiral electrodes being arranged so as to be at least partially bifilar; and a diode component by which the first and second spiral electrodes are connected to each other. Portions of the first and second spiral electrodes are connected in series by the diode component, and the entirety of the connected portions of the first and second spiral electrodes has a perceptible inductivity. Provided with the electroadhension gripper, the examination of the gripper occupation is readily possible.

The electroadhesion gripper allows, in accordance with polarity of a voltage applied across the electrodes, the use of an electroadhesion gripping function over the electrode portions which are constructed in a bifilar manner and in which the voltage difference between the electrodes brings about the formation of an electrical field which brings about the electroadhesion, and the use of an occupation measurement function in which the perceptible inductivity of the portions of the electrodes, which portions are connected in series by means of the diode component, is influenced by the gripper occupation.

A diode component comprises a diode or a plurality of diodes which are connected in series. For example, it is possible to configure a higher breakthrough voltage with a plurality of diodes connected in series. The diode component conducts or blocks in accordance with the polarity of an applied electrical voltage. A breakthrough voltage in the kV range can readily be achieved by using suppressor diodes.

The electrodes typically have at one end a voltage connection. By a voltage being applied with blocking polarity, the electroadhesion function of the complete electrodes (which act here substantially as a field-producing capacitor) can be used; in this instance, the electrodes are electrically insulated from each other. When a voltage is applied with conduction polarity, a measurement variable which is dependent on the inductivity of the entirety of the portions of the electrodes, which portions are connected in series, can be established at least roughly in order to examine the occupation of the electroadhesion gripper (the electrode arrangement acts here substantially as a monitoring coil or measurement coil). Typically, the inductivity when a workpiece is gripped increases substantially, which can be established easily and rapidly, for example, via the charging behavior (or increase of the voltage/current characteristic line) of the electrodes.

The inductivity of the said entirety is dependent on the surface-area and the number of turns (or part-turns) of the two electrodes, which turns are involved in the series connection, the turns of the first electrode and the second electrode contributing with different polarity signs. In order to achieve a perceptible inductivity of the entirety, therefore, the surface-area and/or number of the turns (or part-turns) of the two electrodes, which turns are involved in the series connection, may differ. In some cases, the said perceptible inductivity has a value of at least 5%, preferably at least 10% and particularly preferably at least 20% of the inductivity of the (complete) spiral electrode with the inductivity which has a greater value. The sensitivity during the occupation measurement is improved by a greater, perceptible inductivity.

The two spiral electrodes extend at least partially in a bifilar manner (in a state fitted one in the other and beside each other). An electrical field over the intermediate space between the electrode portions can then be produced between adjacent electrode portions if the electrodes are at different electrical potentials. As a result of the spiral construction, the electrical field has no preferred direction within the face in which the electrodes extend, and good retention of workpieces is possible in all orientations. The spiral electrodes may be in particular of the type of a logarithmic spiral, an Archimedes' spiral or a Fermat's spiral, or a freely selected spiral with substantially spirally extending turns. It should be noted that a spiral may also extend in a non-circular manner (in particular angular manner) or in a non-planar manner (in particular in a screw-like or helix-like manner); however, the two electrodes are preferably constructed in a planar manner in the context of the invention.

The electroadhesion gripper is preferably operated with an electronic control device which is constructed to apply an alternating-current voltage to the electrodes in order to grip and retain a workpiece, and further to examine the gripper occupation in predetermined situations (for instance, after an intended gripping action or depositing action of a workpiece or at predetermined time intervals when a workpiece is retained). An electroadhesion gripper can further be fixed to a common frame with additional electroadhesion grippers, in particular in order to handle one workpiece with a plurality of electroadhesion grippers at the same time. An electroadhesion gripper may be used in particular in industrial production and processing operations, preferably in linked processes, for transporting workpieces such as metal sheets.

In an advantageous embodiment of the electroadhesion gripper, there is provision for the diode component to connect to each other two directly neighboring part-portions of the two electrodes. No additional part-portions of any of the two electrodes are between the directly neighboring part-portions of the two electrodes (in particular in a radial direction). In this embodiment, intersections of strip conductors of the electrodes and the diode component (which would require a multi-layer construction) can be prevented, which substantially simplifies the structure of the electroadhesion gripper.

A development of this embodiment is preferred in which the diode component connects an nth turn of one of the two electrodes when counting from the outer side to an n+1th turn of the other electrode when counting from the outer side, with $n \in \mathbb{IN}$ and $n \geq 1$, preferably where $n=1$. A number of turns of the turns of the two electrodes, which number is different by one, and which turns are involved in the series connection, can thereby be readily configured in electrodes with voltage connections configured substantially at the same peripheral position (at the same angle of rotation), at $n=1$ even with a maximum surface-area of the differential turn, with the same total turn numbers of the two electrodes (and therefore a large electroadhesion face) being able to be configured.

A development is further preferred in which the two spiral electrodes are connected via the diode component at the end thereof remote from a voltage connection in each case, in particular with the two spiral electrodes being connected via the diode component at the inner end thereof in each case. The diode component can be arranged in the region of the electrode ends in a particularly simple manner and the spacing of the electrodes in the bifilar region is hardly impaired by the size of the diode component even if the diode component is in the plane of the electrodes. However, non-identical total turn numbers of the two electrodes (which reduce the effective electroadhesion face) and/or non-identical surface-area overlaps of the electrodes (which generally allow only a small inductivity difference of the electrodes) must be accepted.

An embodiment is particularly preferred in which at least one of the two electrodes is connected to the diode component with spacing from the end thereof remote from a voltage connection, in particular with the other electrode being connected to the diode component with the end thereof remote from a voltage connection. That embodiment allows the removal of a portion of an electrode from the series connection of the diode component with conduction polarity, which portion is remote from the voltage connection, and thereby allows configuration or increase of the non-equality of the contributions of the two electrodes to the inductivity of the entirety of the portions of the electrodes, which portions are involved in the series connection. In principle, however, the removed portion can contribute completely to the electroadhesion function with blocking polarity. That embodiment can be configured in particular with equal total numbers of turns or equal surface overlaps of the two electrodes so that an extensive, efficient electroadhesion gripper can be configured so as to have high inductivity for a simple measurement of occupation. Typically, however, in this embodiment a connection between non-directly neighboring part-portions of the electrodes is configured, which brings about intersections of strip conductors, whereby the structure of the electroadhesion gripper becomes slightly more complex.

In a particularly preferred embodiment, the number of turns of the first spiral electrode and the second spiral electrode which are connected to each other in series by means of the diode component is unequal. This is a simple and very efficient means for ensuring sufficient inductivity of the entirety of the portions of the two electrodes, which portions are connected via the diode. To this end, for example, one of the electrodes (compared with the other electrode) may have additional turns radially outside and/or radially inside the other electrode, the electrodes generally being connected at the end side via the diode component in each case. It is also possible to bring about contacting at two electrodes with typically an equal total number of turns (number of turns) with the diode component with different turns (for instance, at the first turn and fourth turn when counting from the outer side). Alternatively to this embodiment, an equal number of turns of the two coils may also be serially connected to each other via the diode component (generally, the total numbers of turns of the electrodes also being equal); in this case, the faces overlapped by those turns of the two coils should be substantially different in order to ensure sufficiently great inductivity.

In an advantageous embodiment, the radial spacing of the electrodes remains constant as a function of the spiral radius at the locations where the electrodes are arranged in a bifilar manner. A homogeneous force distribution of the electroadhesion gripper can thereby be achieved; field peaks or voltage breakdowns are prevented.

In an alternative embodiment which is also advantageous, the radial spacing of the electrodes is variable as a function of the spiral radius at locations where the electrodes are arranged in a bifilar manner. The force distribution of the electroadhesion gripper can thereby be selectively influenced. For example, the radial spacing can be reduced in a radially outward direction in order to achieve a higher force at that location via a higher electrical field strength (for instance, in order to support the sealing of a sealing lip of an additional suction gripper function). Similarly, a difference in the surface overlap of the two spiral electrodes or one of the turns thereof can be changed selectively in order to increase the total inductivity of the portions of the two electrodes, which portions are connected in series by the diode component.

An embodiment is further preferred which makes provision for the first spiral electrode to extend at least substantially in a first plane and for the second spiral electrode to extend at least substantially in a second plane, and for the planes to coincide or to be arranged parallel with a maximum spacing of 3.0 mm, preferably with a maximum spacing of 2.0 mm. The planar structure of the electrodes or the associated electroadhesion face (gripping face) affords access to workpieces with planar outer faces, which occurs very often. The small or vanishing spacing allows the configuration of high field strengths and therefore high adhesion forces.

In an alternative, advantageous embodiment, there is provision for the two spiral electrodes to be arranged or constructed at a substantially cone-outer-like or bell-like inner side of a common carrier and to extend helically. The carrier with the cone-outer-like or bell-like inner side may be in particular a flexible suction member of an additional suction gripper function. The electroadhesion then supports secure retention of the suction gripper in the drawn-in state.

An advantageous embodiment makes provision for the two spiral electrodes and the diode component to be arranged on a self-adhesive film which is bonded to a workpiece-facing side of the electroadhesion gripper. This is particularly simple for producing the electrodes and the fitting thereof to the gripper. It should be noted that the self-adhesive film can also be constructed in several layers. A self-adhesive film can also be readily retrofitted to existing grippers (for instance, suction grippers or magnetic grippers).

An embodiment is also advantageous in which the two electrodes are covered by an insulation layer at a workpiece-facing side. This prevents a short-circuit of the electrodes via a gripped conductive (for instance, metal) workpiece so that such a workpiece can also be gripped without special preparation.

In a development of this embodiment, there is provision for a wear layer to be arranged at a workpiece-facing side of the insulation layer, in particular with the wear layer comprising a graphite-containing plastics material or a plastics material supplemented with metal particles. The wear layer prevents, on the one hand, abrasion of the electrodes or the insulation layer protecting them; on the other hand, it makes it easier to monitor the state of the electroadhesion gripper. A parameter which is continuously dependent on the thickness of the wear layer is preferably established occasionally in order to establish the degree of wear of the gripper.

An embodiment of the electroadhesion gripper is particularly preferred which provides for a suction gripper further to be constructed on the electroadhesion gripper, the suction gripper forming a suction chamber which is delimited by a suction member and a sealing lip, in particular with a gripping face of the electroadhesion gripper and a gripping face of the suction gripper overlapping each other at least partially or abutting each other. The electroadhesion function and the suction gripper function can supplement and increase each other. Workpieces which are provided with a large number of apertures or recesses (and which therefore cannot be handled with a suction gripper owing to an excessively great leak rate) can be handled via the electroadhesion function. The gripping faces designate the faces of the retention function in which a retention force is applied. By the gripping faces being suitably divided, adaptation to a specific workpiece type can be carried out, in particular with faces containing apertures being associated with the electroadhesion function.

A development of this embodiment is particularly preferred in which at least a portion of the two spiral electrodes in each case is constructed in a workpiece-facing region of the sealing lip or directly adjacent to the workpiece-facing region of the sealing lip. The electroadhesion function can thereby support the sealing of the suction gripper against the workpiece in the region of the sealing lip so that a leak rate of the suction gripper can be reduced.

Another advantageous development makes provision for at least a portion of the two spiral electrodes in each case, and preferably also the diode component, to be integrated in the suction member in the region of a workpiece-facing side of the suction member. It is thereby possible to achieve an extended service-life and continuous operation quality; the strip conductors of the electrodes acquire powerful mechanical protection as a result of the embedding (typically plastics embedding in the suction member region formed from an elastomer material).

An embodiment is also particularly preferred in which a magnetic gripper is further formed on the electroadhesion gripper, in particular with a gripping face of the electroadhesion gripper and a gripping face of the magnetic gripper at least partially overlapping or adjoining each other. The electroadhesion function and the magnetic gripper function may supplement and increase each other. Workpieces which are at least partially non-magnetic (and which therefore cannot be handled with a magnetic gripper) can be handled via the electroadhesion function. The gripping faces designate the faces of the retention function in which a retention force is applied. By the gripping faces being suitably divided, adaptation to a specific workpiece type can be carried out, in particular with non-magnetic faces being associated with the electroadhesion function. It should be noted that the magnetic field of the magnetic gripper function is in no way impaired by the electrical field of the electroadhesion function, and vice versa.

An advantageous development of that embodiment makes provision for at least a portion of a gripping face of the electroadhesion gripper to be arranged in an annular manner around a gripping face of the magnetic gripper. An annular region around the magnetic gripper can readily be provided with peripheral spiral electrodes for an electroadhesion function.

It is preferable for the portion of the gripping face of the electroadhesion gripper, which portion annularly surrounds the gripping face of the magnetic gripper, to be resiliently supported, in particular with that portion being pretensioned into a position, in which that portion protrudes relative to the gripping face of the magnetic gripper, and in particular with that portion being subdivided into individually movable, resiliently supported zones. The resilient support allows adaptation to a non-planar shape of a workpiece for better gripping function of the hybrid gripper; it should be noted that the resilience preferably also allows a certain play with respect to tilting. An even finer adaptation to the shape of the workpiece can be brought about as a result of division into zones.

Another aspect of the invention features a method for operating an above-described electroadhesion gripper which is characterized in that an alternating-current voltage is applied between the two electrodes. The alternating-current voltage which is particularly used to grip and retain a workpiece (which may be dielectric or of metal) allows both a good gripping function and a simple examination of occupation for the electroadhesion gripper. The gripping and/or retention can be supported by a suction function and/or a magnetic retention function if the electroadhesion gripper is configured for this. The alternating-current voltage alternates at regular times between a charged and discharged state of the electrodes. The alternating-current voltage preferably has an at least approximately sinusoidal extent. It should be noted that the alternating-current voltage from half-wave to half-wave does not necessarily have to alternate the polarity.

In a preferred variant of the method, there is provision for the alternating-current voltage to have an amplitude in a range between 1 kV and 20 kV, preferably between 5 kV and 10 kV, and/or for the alternating-current voltage to have a frequency in a range between 500 Hz and 20 kHz, preferably between 1 kHz and 10 kHz. Good results have been obtained in practice with those amplitudes (peaks to zero) and frequencies. It should be noted that an alternating-current voltage having a higher frequency (generally 1 kHz or higher, preferably 2 kHz or higher) is generally used for gripping conductive workpieces.

In a particularly advantageous variant of the method, a plurality of successive half-waves of the alternating-current voltage have an equal, first polarity, the diode component blocking at this first polarity. In the first polarity, the adhesion function can be fully used; the electrical field may be produced between the electrodes (which are effectively electrically insulated from each other). Typically, the greatly predominant majority (90% or more, preferably 99% or more) of the half-waves has the first polarity. The adhesion force remains substantially maintained by means of the plurality of successive half-waves of the first polarity; the workpiece is retained in a particularly secure and reliable manner.

A variant of the method is advantageous in which the occupation of the electroadhesion gripper is determined during one or more successive half-waves of the alternating-current voltage having a second polarity, at which the diode component is conductive. In order to examine the occupation, there is established a measurement variable which is dependent on the inductivity of the series-connected portions of the two spiral electrodes; as a result of being occupied or not being occupied, the magnetic susceptibility in the relatively close vicinity of the electrodes changes substantially (often by a factor up to $10^3$), which has an effect on the effective inductivity. The charging behavior of the portions of the electrodes is preferably measured, which portions now act as a measurement coil and are connected in series, for instance, by means of a time progression of the voltage at the electrodes during charging thereof typically over a series resistance for a known time progression of the charging voltage (in this instance, the time is typically established after which a specific voltage is reached at the electrodes, or the voltage which is reached at the electrodes after a specific time). In principle, such measurements need to be carried out only over a single half-wave (or even only a half half-wave); therefore, alternation is preferably carried out again to the first polarity of the adhesion operation on occasion of an occupation measurement at the latest after one half-wave of the second polarity, in order not to lose a retained workpiece or to retain it again rapidly with great force. Only a very small number of half-waves (typically 10% or less, preferably 1% or less) typically have the second polarity. It should be noted that, according to this variant, half-waves of the second polarity can also be carried out without a measurement of the occupation (in particular if switching is periodically brought about between the first and second polarity irrespective of being caused as a result of a measurement of occupation). It is also possible, to check the occupation, to act on the electrodes with a half-wave or a small number of successive half-waves of the second polarity, after the alternating-current voltage has been switched off beforehand, in order to deposit a workpiece.

A variant of the method is also preferred in which, during one or more successive half-waves of the alternating-current voltage at a second polarity, at which the diode component is conductive, the wear degree of the electroadhesion gripper is determined. In order to establish the degree of wear (for instance, the establishment of the remaining thickness of a wear layer fitted to the electrodes at the workpiece side), the inductivity of the entirety of the portions of the electrodes, which portions are connected in series by the diode component, is generally established in a precise manner, for example, via the resonance frequency or quality factor of an oscillating circuit which contains the said entirety. The inductivity is influenced by means of the susceptibility contribution of the wear layer. The wear degree is typically measured by means of a relatively large number of half-waves of the second polarity (for example, ten or more). Preferably, no workpiece is retained during such a measurement in order not to superimpose the susceptibility change of the variably thick wear layer by means of the generally very large susceptibility contribution of the workpiece. Furthermore, the risk of the workpiece being lost over the time of the measurement is also reduced.

In an advantageous variant, there is further provision for the alternating-current voltage between the electrodes to be switched off and the workpiece to be blown off the electroadhesion gripper in order to deposit a workpiece. It is thereby possible to deposit it in a particularly rapid manner, in particular when a specific electroadhesion still acts as a result of a (capacitively retained) residual voltage. This variant can be used particularly well in an electroadhesion gripper having an additional suction gripper function; in the case of vacuum grippers, a blow-off action is provided for in any case in the operating cycle.

Additional advantages of the invention will be appreciated from the description and the drawings. Similarly, the above-mentioned features and those set out below may be used according to the invention individually per se or together in any combination. The embodiments shown and described should not be understood to be a conclusive listing, but are instead of exemplary character for describing the invention.

The invention is illustrated in the drawings and is explained in greater detail with reference to embodiments.

DESCRIPTION OF DRAWINGS

FIG. 12c is a schematic bottom view of the electroadhesion gripper of FIG. 12a.

DETAILED DESCRIPTION

Figure 1A:
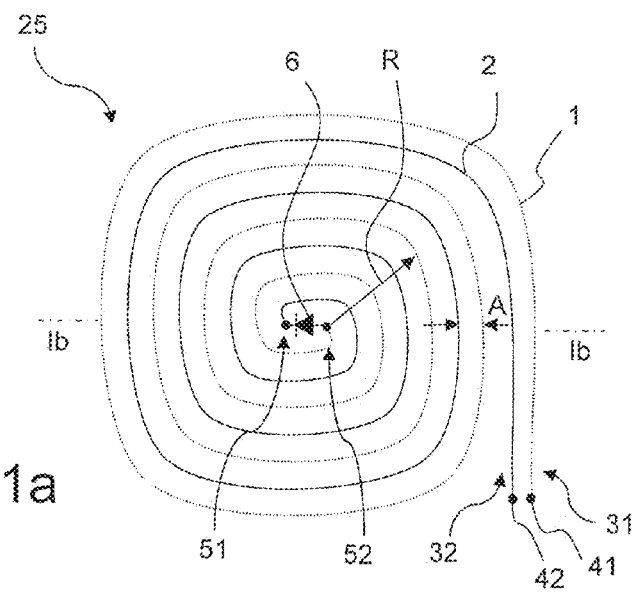
FIG. 1a is a schematic top view of an electrode arrangement of a first embodiment of an electroadhesion gripper, having a diode which is connected to the inner electrode ends.

FIG. 1a is a schematic top view of the region of an electrode arrangement 25 of a first embodiment of an electroadhesion gripper.

The electrode arrangement 25 comprises a first spiral electrode 1 (illustrated with a dotted line) and a second spiral electrode 2 (illustrated as a solid line). The two electrodes 1, 2 extend in a completely bifilar manner and each comprise approximately four turns; the spacing A of the electrodes 1, 2 (measured approximately perpendicularly to the local electrode extent) is substantially equal for all the spiral radii R in this instance. At an outer end 31, 32 of the electrodes 1, 2, respectively there are provided voltage connections 41, 42 in order to connect an electrical voltage (preferably an alternating-current voltage). A diode component 6, here comprising a single diode, is connected to the inner ends 51, 52 of the electrodes 1, 2; the inner ends 51, 52 may also be referred to here as the ends located remotely from the voltage connections 41, 42.

For electroadhesion operation, the voltage is connected with a polarity in the blocking direction of the diode component 6 (that is to say, with a higher electrical potential at the voltage connection 42 than at the voltage connection 41). An electrical field, which attracts a workpiece which abuts in a planar manner (for instance, above the plane of the drawing, not illustrated) is formed between the electrodes 1, 2 which are then insulated from each other.

For measuring occupation, the voltage is connected with a polarity in the conduction direction (that is to say, with a higher electrical potential at the voltage connection 41 than at the voltage connection 42). The two spiral electrodes 1, 2 are then connected in series. The inductivities of the two electrodes 1, 2 cancel each other out to a large extent because the two electrodes 1, 2 are subjected to flow by the electric current in opposite directions. Since the first spiral electrode 1 beginning from a location further outward takes up a slightly greater surface-area and is also slightly longer (with respect to the number of turns) than the second electrode 2 in the direction towards the inner end, a perceptible inductivity of the electrodes 1, 2 which are series-connected via the diode component 6 remains. This inductivity is influenced by a workpiece which may be present in the vicinity of the electrode arrangement 25, which can be established by a suitable measurement (for instance, the time progression of the voltage increase over a half-wave of the alternating-current voltage).

Figure 1B:
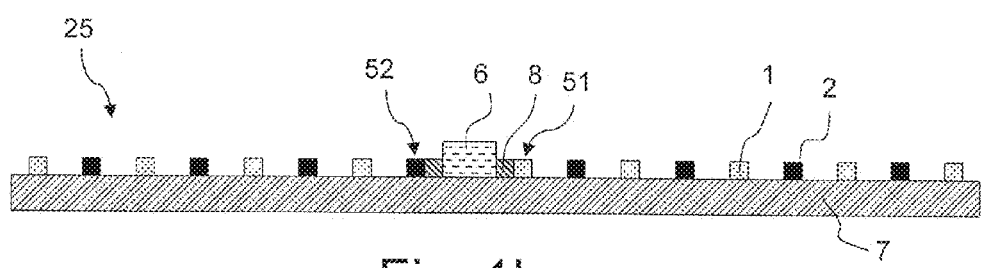
FIG. 1b is a schematic cross-section through the electrode arrangement of FIG. 1a in plane Ia with a single-layer structure.

FIG. 1b is a schematic cross-section through the electrode arrangement 25 of FIG. 1a in plane Ib. The strip conductors of the first electrode 1 (illustrated with dots) and the second electrode 2 (illustrated in a solid manner) are arranged on a carrier 7 which is constructed here as a self-adhesive film (with the adhesive side directed upwards), and the diode component 6 connects the inner ends 51, 52 of the electrodes 1, 2 via conductive connections 8. In other words, the planes in which the electrodes 1, 2 are arranged coincide. That single-layer construction is readily possible since the electrode arrangement 25 does not have any intersections of strip conductors.

Figure 1C:
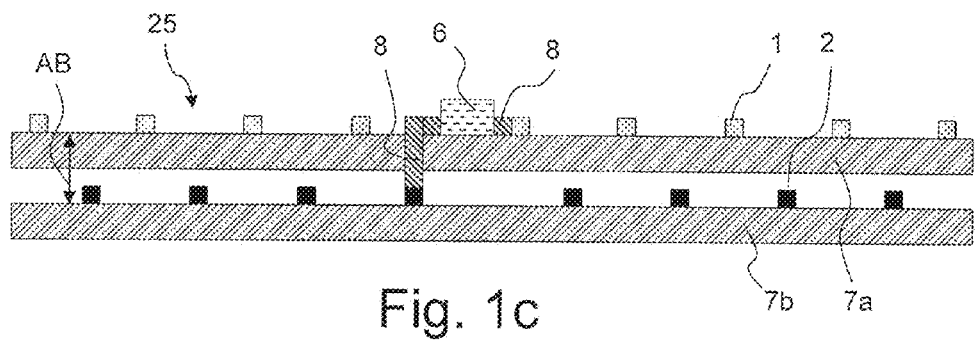
FIG. 1c is a schematic cross-section through the electrode arrangement of FIG. 1a in plane Ia with a two-layer structure.

Alternatively, a two-layered construction may also be provided, wherein the electrodes 1, 2 are arranged on different carriers 7a, 7b, cf. FIG. 1 c, with the first electrode 1 and the diode component 6 being arranged on the upper carrier 7a in this instance. In this case, a through-plating 8a can be used to connect the diode component 6 to the second electrode 2 on the lower carrier 7b in a conductive manner. The two carriers 7a, 7b are preferably adhesively bonded to each other. The spacing AB of the parallel planes, in which the two electrodes 1, 2 are each arranged (or the spacing AB of the upper sides of the carriers 7a, 7b to which the electrodes 1, 2 are applied), is preferably 3 mm or less, particularly preferably 2 mm or less; when using film-like carriers 7a, 7b, the spacing AB may also readily be 500 μm or less.

Figure 2:
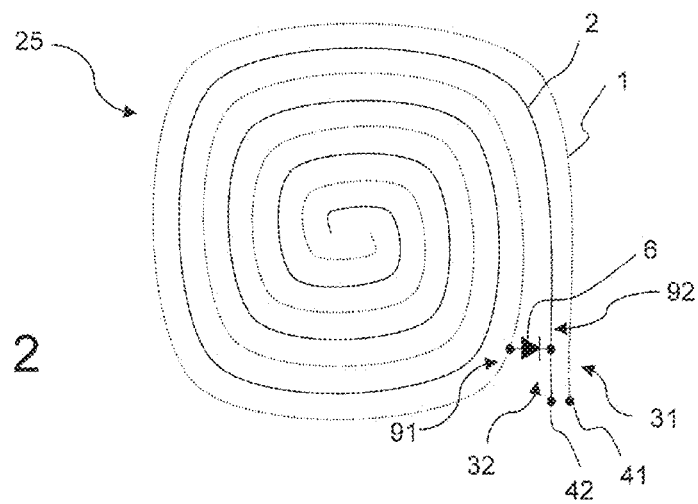
FIG. 2 is a schematic top view of an electrode arrangement of a second embodiment of an electroadhesion gripper, having a diode which is connected between the second-outermost turn of a first electrode and the outermost turn of a second electrode.

FIG. 2 shows a second embodiment of an electrode arrangement 25. In this instance, the first turn (counted from the outer side) of the second electrode 2 is connected to the second turn (counted from the outer side) of the first electrode 1 via the diode component 6; the diode component 6 connects directly neighboring part-portions 91, 92 of the electrodes 1, 2. The (outer) ends 31, 32 at which the voltage connections 41, 42 are configured are constructed in this instance substantially in the same rotational angle position of the two spiral electrodes 1, 2.

When a voltage is applied to the voltage connections 41, 42 with conduction polarity, a current can flow from the voltage connection 41 via a portion of the first electrode 1, that is to say, the outermost turn of the first electrode 1, to the diode component 6, then through the diode component 6 and finally via a very short portion of the second electrode 2 to the voltage connection 42. A relatively high inductivity of the portions of the electrodes 1, 2, which portions are series-connected via the diode component 6, is thereby provided (in comparison with the electrode arrangement of FIG. 1a) because the surface-area of the outermost turn of the first electrode 1 is quite large.

Figure 3A:
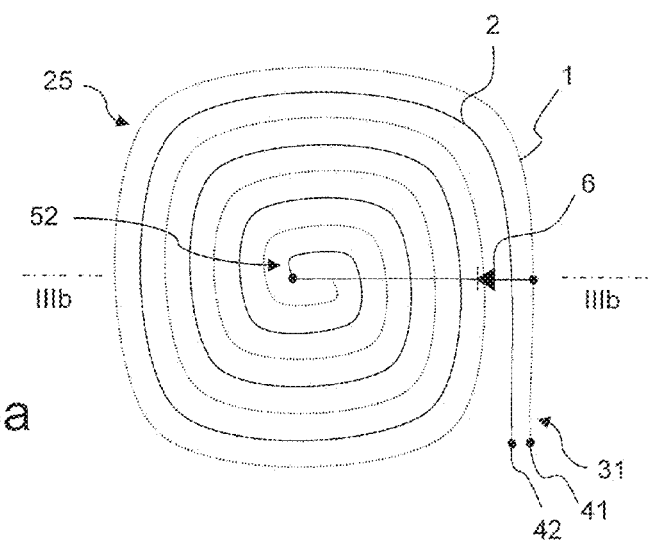
FIG. 3a is a schematic top view of an electrode arrangement of a third embodiment of an electroadhesion gripper, having a diode which is connected between the outermost turn of a first electrode and the inner end of a second electrode.

The embodiment shown in FIG. 3a can provide an even greater inductivity of the portions of the first and second electrodes 1, 2, which portions are connected with conduction polarity via the diode component 6. The diode component 6 connects in this instance the outermost turn of the first electrode 1 near the outer end 31 (at which the voltage connection 41 is formed) to the inner end 52 of the second electrode 2. A current can flow in this instance from the voltage connection 41 via a small portion of the first electrode 1 through the diode component 6 and subsequently through the entire second electrode 2 as far as the voltage connection 42. Consequently, all approximately four turns of the second coil 2 are used.

Figure 3B:
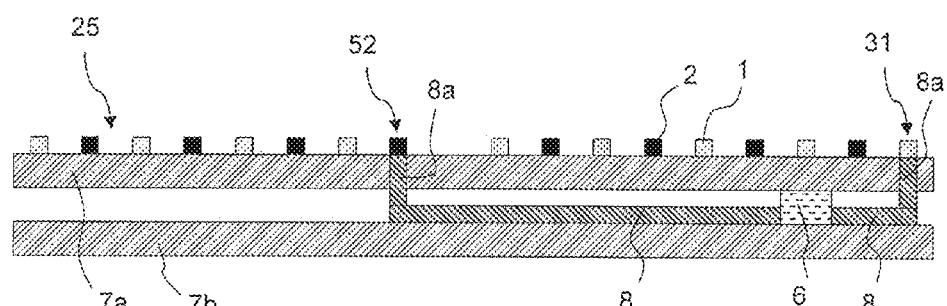
FIG. 3b is a schematic cross-section through the electroadhesion gripper of FIG. 3a in plane IIIb.

However, this embodiment requires a two-layer construction, cf. the schematic sectional view illustrated in FIG. 3b in the plane Mb in FIG. 3a. The connection between the second electrode 2 at the inner end 52 and the first electrode 1 at the outer end 31 requires an intersection of the turns located radially therebetween. In the embodiment shown, therefore, the electrodes 1, 2 are arranged on a first (here, upper) carrier 7a and the conductive connections 8 between the two through-platings 8a and the diode component 6, similarly to the diode component 6 itself, are arranged on a second (here, lower) carrier 7b. The two carriers 7a, 7b are again preferably adhesively bonded to each other.

Figure 4:
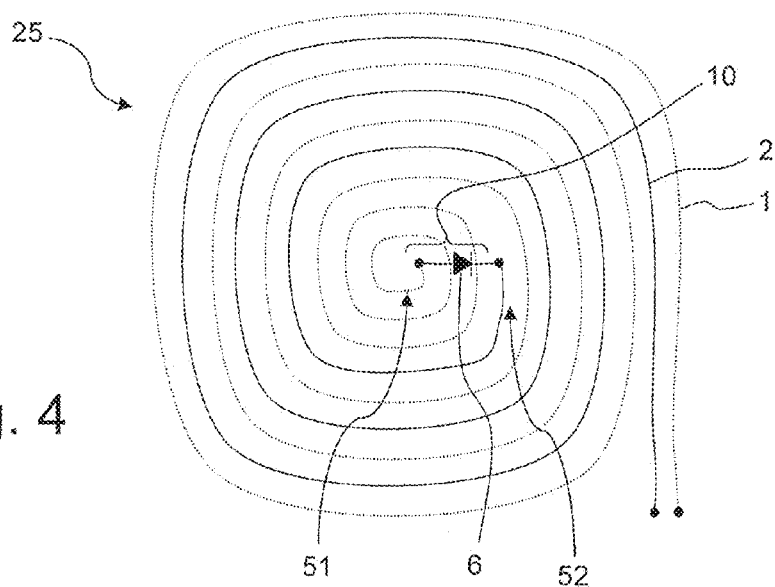
FIG. 4 is a schematic top view of an electrode arrangement of a fourth embodiment of an electroadhesion gripper, having a diode which is connected to the inner electrode ends, the first diode having additional, radially inner turns.

The electrode arrangement 25 of an embodiment of an electroadhesion gripper is illustrated in FIG. 4, in which the inner ends 51, 52 of the electrodes 1, 2 are connected via the diode component 6. In this instance, however, the first electrode 1 has three additional turns 10 in comparison with the second electrode 2 in the radially inner region. Those turns increase the inductivity of the first electrode 1 in relation to the second electrode 2 so that the inductivity of the electrodes 1, 2 (complete in this instance) which are connected in series by the diode component 6 with conduction polarity is substantially increased in comparison with the embodiment of FIG. 1a. It should be noted that the additional turns 10 of the first electrode are not arranged in a bifilar manner owing to the lack of a counterpart in the second electrode 2.

Figure 5:
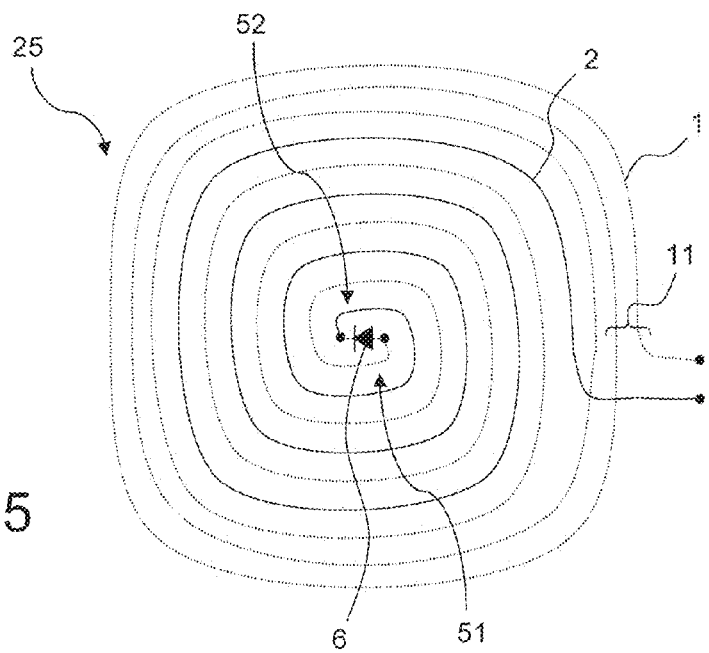
FIG. 5 is a schematic top view of an electrode arrangement of a fifth embodiment of an electroadhesion gripper, having a diode which is connected to the inner electrode ends, the first diode having additional, radially outer turns.

Similarly, it is possible to provide additional turns 11 of the first electrode 1 in a radially outer position, cf. FIG. 5. In the series connection of the electrodes 1, 2 (here, complete) via the diode component 6 at the inner ends 51, 52, those additional turns 11 (here, two) again increase the inductivity of the first turn 1 in relation to the second turn 2. The additional turns 11 are again not arranged in a bifilar manner owing to the lack of a counterpart in the second electrode 2.

It should be noted that conductive intersections have to be configured in the embodiments of FIG. 4 and FIG. 5.

Figure 6:
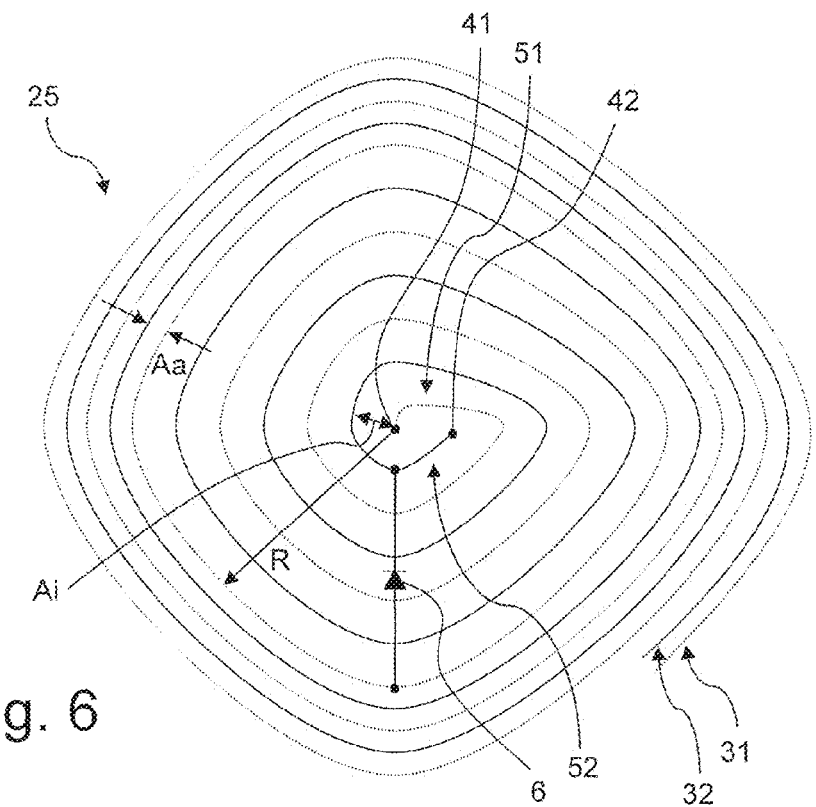
FIG. 6 is a schematic top view of an electrode arrangement of a sixth embodiment of an electroadhesion gripper, having an outwardly reduced radial spacing of the electrodes.

FIG. 6 shows an embodiment in which the spacing of the electrodes 1, 2 (measured in an approximately perpendicular manner relative to the local electrode extent) for a small spiral radius R, that is to say, in a radially inner region (cf. spacing Ai) is greater than for a large spiral radius R, that is to say, in a radially outer region (cf. spacing Aa, for approximately the same rotational angle position). As a result of the smaller electrode spacing Aa in a radially outer position, a greater electrical field strength is achieved there between the electrodes 1, 2 when a voltage is applied to the voltage connections 41, 42 with blocking polarity. It should be noted that the voltage connections 41, 42 are configured here at the inner ends 51, 52 of the electrodes 1, 2. The outer ends 31, 32 are free; the outer ends 31, 32 may here be referred to as the ends of the electrodes 1, 2, which ends are remote from the voltage connections 41, 42.

In this embodiment, with conduction polarity, a current can flow from the voltage connection 41 through an inner portion (that is to say, the innermost two-and-a-half turns) of the first electrode 1, continuing through the diode component 6 and finally through a short portion of the second electrode 2 as far as the voltage connection 42.

Figure 7:
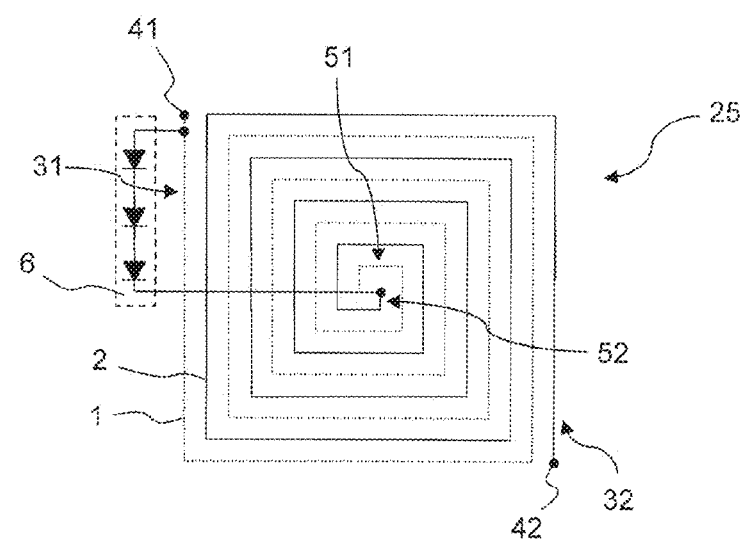
FIG. 7 is a schematic top view of an electrode arrangement of a seventh embodiment of an electroadhesion gripper, having electrodes which extend around corners and a diode component comprising three series-connected diodes.

FIG. 7 shows an embodiment in which the electrodes 1, 2 comprise linearly extending portions which adjoin each other at right-angled corners.

The voltage connections 41, 42 are constructed at the outer ends 31, 32 of the electrodes 1, 2, the outer ends 31, 32 being constructed at rotation angles of the spiral electrodes 1, 2, which angles are offset through 180°. The inner end 52 of the second electrode 2 is connected in this instance via a diode component 6 to the first electrode 1 in the region of the outer end 31 thereof so that the inductivity of the portions of the electrodes 1, 2, which portions are connected in series via the diode component 6, corresponds substantially to the inductivity of the second electrode 2.

As an additional characteristic feature, the diode component 6 has (here) three series-connected diodes. With blocking polarity, a voltage which is accordingly approximately three times higher than when using only one diode can thereby be applied without a voltage breakdown being produced at the diode component 6.

Figure 8:
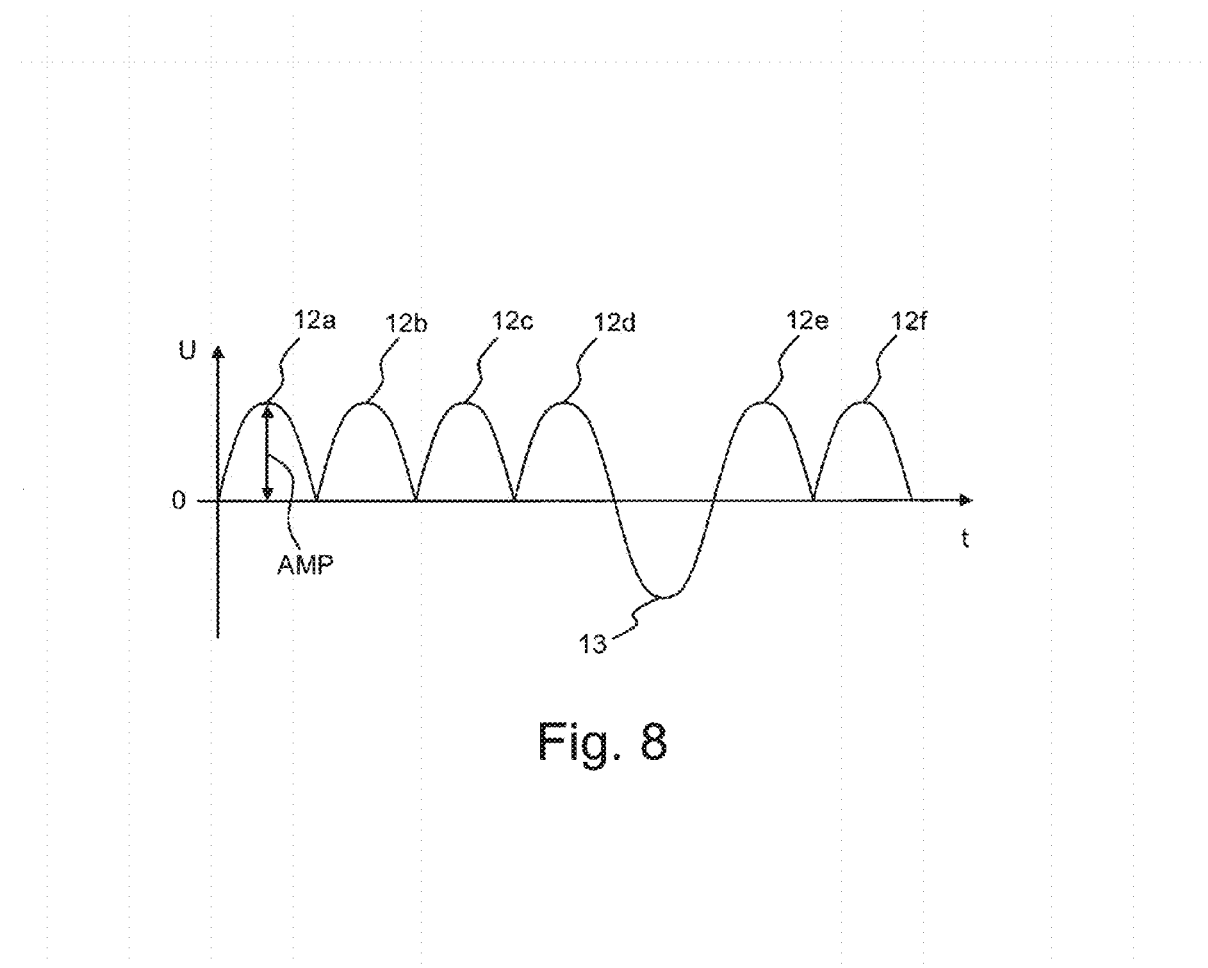
FIG. 8 is a schematic illustration of the time progression of an alternating-current voltage which is applied across the electrodes of an electroadhesion gripper.

FIG. 8 illustrates by way of example the time progression of an alternating-current voltage, cf. the voltage U as a function of time t in the graph of FIG. 8 with which an electroadhesion gripper can be operated. The voltage U can be applied directly or via a series resistance to the voltage connections of the electrode arrangement of an electroadhesion gripper.

The voltage U has a progression which is sinusoidal in principle, with a large number of half-waves, here with a constant amplitude AMP. However, the predominant number of half-waves (illustrated here, by way of example, are the first four successive half-waves 12a-12d and also the last two illustrated, successive half-waves 12e-12f) have the same first polarity and a minority of half-waves (illustrated here, by way of example, is the half-wave 13) have a second polarity.

The first polarity corresponds to the blocking direction of the diode component of the electroadhesion gripper, in which a powerful electrical field is produced between the electrodes and with which workpieces (for example, metal sheets) can be gripped and retained. It should be noted that, for the gripping function, the voltage source has to provide a power of typically only 1-5 Watt for non-metal workpieces and typically 10-50 Watt for metal workpieces.

The second polarity corresponds to the conduction direction of the diode component, with which direction the portions of the electrodes connected in series by the diode component configure a measurement coil and it is possible to carry out an examination of occupation (that is to say, an examination as to whether a workpiece is currently retained on the electroadhesion gripper or not). The inductivity of the measurement coil is different depending on the occupation, which can be established by suitable measurements. Occupation measurements can be used to examine whether a workpiece has been successfully gripped and/or whether a workpiece has been lost in the meantime (during a retention time in which the workpiece is typically transported) and/or whether a workpiece has been successfully deposited.

Generally, a precise establishment of the inductivity of the measurement coil does not have to be carried out for an occupation measurement; a rough evaluation of the charging behavior (for instance, over a half half-wave) is generally sufficient.

If a more precise establishment of the inductivity is carried out, for instance, via the establishment of the resonance frequency or quality factor of an oscillation circuit which contains the measurement coil (for which, typically, ten or more successive half-waves of the second polarity are measured, not illustrated), the wear degree of the electroadhesion gripper or the remaining thickness of a wear layer on the electroadhesion gripper can also be established. That measurement is preferably carried out without any workpiece; alternatively, the measurement can also be carried out with a workpiece, but then the susceptibility properties of the workpiece (or the influence thereof on the inductivity in dependence of the thickness of the wear layer) should be known, and the measurement should be so short that the workpiece does not fall from the gripper.

Furthermore, general examinations may also be carried out, for instance, in relation to the state of the electroadhesion gripper (good/defective; suction member also good/broken in case of additional suction function), the construction type of the electroadhesion gripper (suitability for specific transport functions, suitability for handling specific workpieces, optionally dependent on the orientation of a gripper frame, size of the gripping faces, service-life), and the like.

Figure 9:
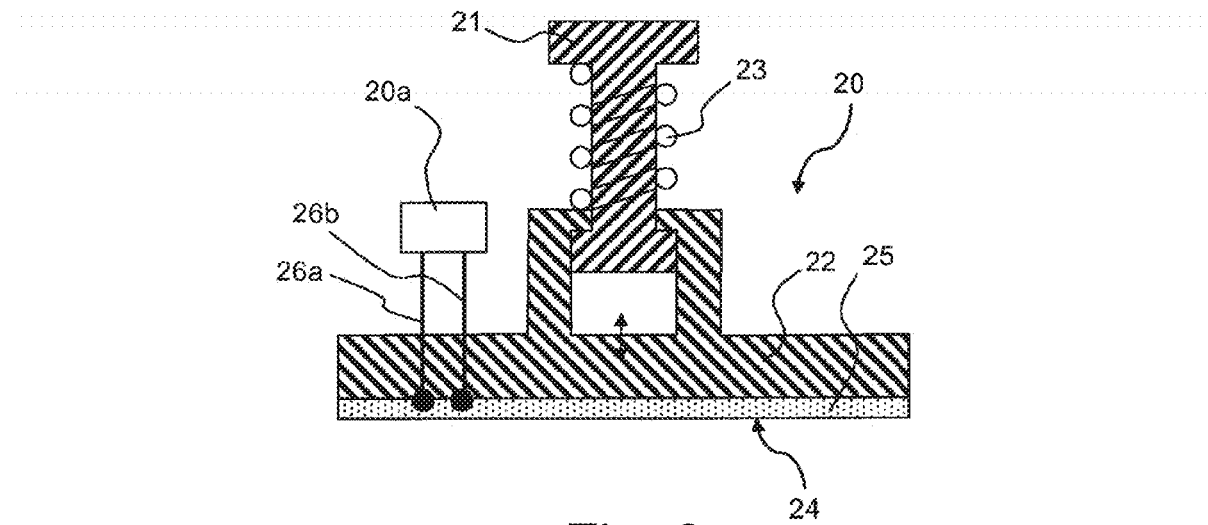
FIG. 9 is a schematic cross-section through an electroadhesion gripper without additional gripping functions.

FIG. 9 shows an electroadhesion gripper 20, with a gripper base 21 (which is secured, for example, to a robot arm) and a gripper head 22 which is supported on the gripper base 21. An electrode arrangement 25 (which is planar here) is fitted to the lower side of the gripper head 22 and forms a gripping face (electroadhesion face) 24 (which is planar in this instance). The electrode arrangement 25 is supplied with operating voltage from a control device 20a via two cable strands 26a, 26b which lead to the voltage connections of the electrodes and is measured by means of the control device 20a for examining the occupation.

The gripper head 22 can be displaced relative to the gripper base 21 counter to the force of a spring 23 so that the gripper head 22 can give way slightly when the electroadhesion gripper 20 is placed on a workpiece from above (not illustrated).

Figure 10:
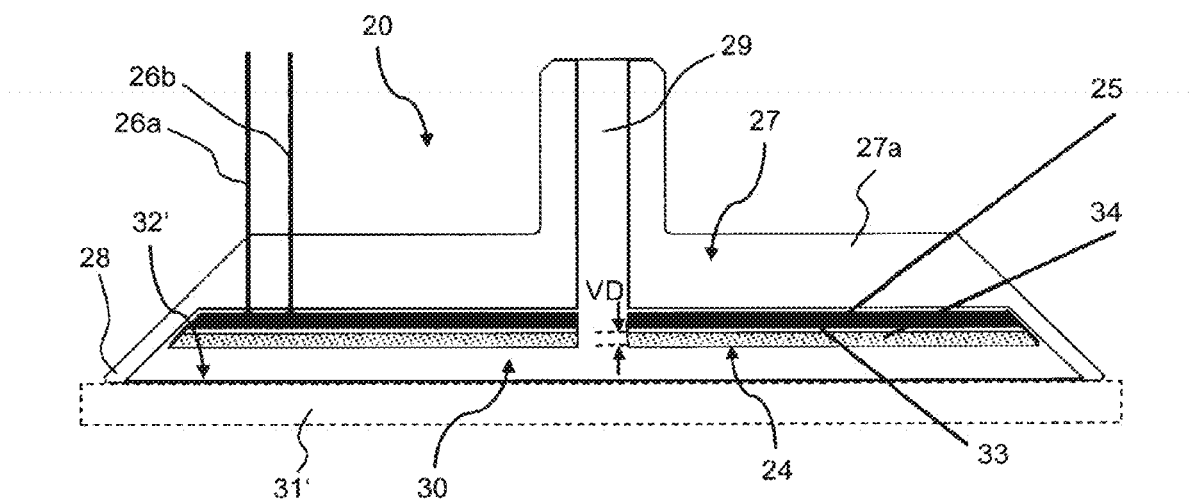
FIG. 10 is a schematic cross-section through an electroadhesion gripper with an additional suction gripper function with a planar electroadhesion face.

FIG. 10 shows an electroadhesion gripper 20 which is further constructed so as to have a suction gripper 27 (hybrid gripper).

The suction gripper 27 has a bell-like suction member 27a, on which a peripheral sealing lip 28 is formed. A suction chamber 30, which is delimited by the suction member 27a, the sealing lip 28 and by an abutting workpiece 31' (after application against a workpiece) (indicated with broken lines), can be evacuated by means of a suction connection 29 in order to retain the workpiece 31'. The lower edge of the sealing lip 28 defines a gripping face 32' of the suction gripper 27. During evacuation, the workpiece 31' is drawn upwards with the resilient deformation of the sealing lip 28 and optionally also the suction member 27a.

An electrode arrangement 25, whose electrodes (not illustrated in greater detail) are connected to a voltage source or control device (not illustrated in greater detail) via cable strands 26a, 26b, is fitted (adhesively bonded in this case) to the workpiece-facing planar side of the suction member 27a. An insulation layer 33 is applied to the electrode arrangement 25 in order to electrically separate the electrodes from the workpiece 31' in a reliable manner and thus to prevent short-circuits between the electrodes. In this instance, a wear layer 34 comprising graphite-containing plastics material is applied to the insulation layer 33 in order to prevent abrasion of the insulation layer 33 during continuous industrial use. The wear layer 34 may, when required or at regular maintenance intervals, be replaced; the remaining thickness VD in the context of the invention can also be established by suitable measurements (see above).

The lower side of the wear layer 34 forms in this instance the actual gripping face 24 of the electroadhesion gripper 20; in this instance, it is completely overlapped by the gripping face 32' of the suction gripper 27. The suction function and the electroadhesion function can thereby readily support each other for gripping and retaining workpieces. In order to deposit (release) a workpiece 31', air (or another gas) can be blown via the suction connection 29 so that the workpiece 31 can also be rapidly and reliably deposited counter to residual adhesion forces after the electroadhesion voltage has been switched off.

Figure 11:
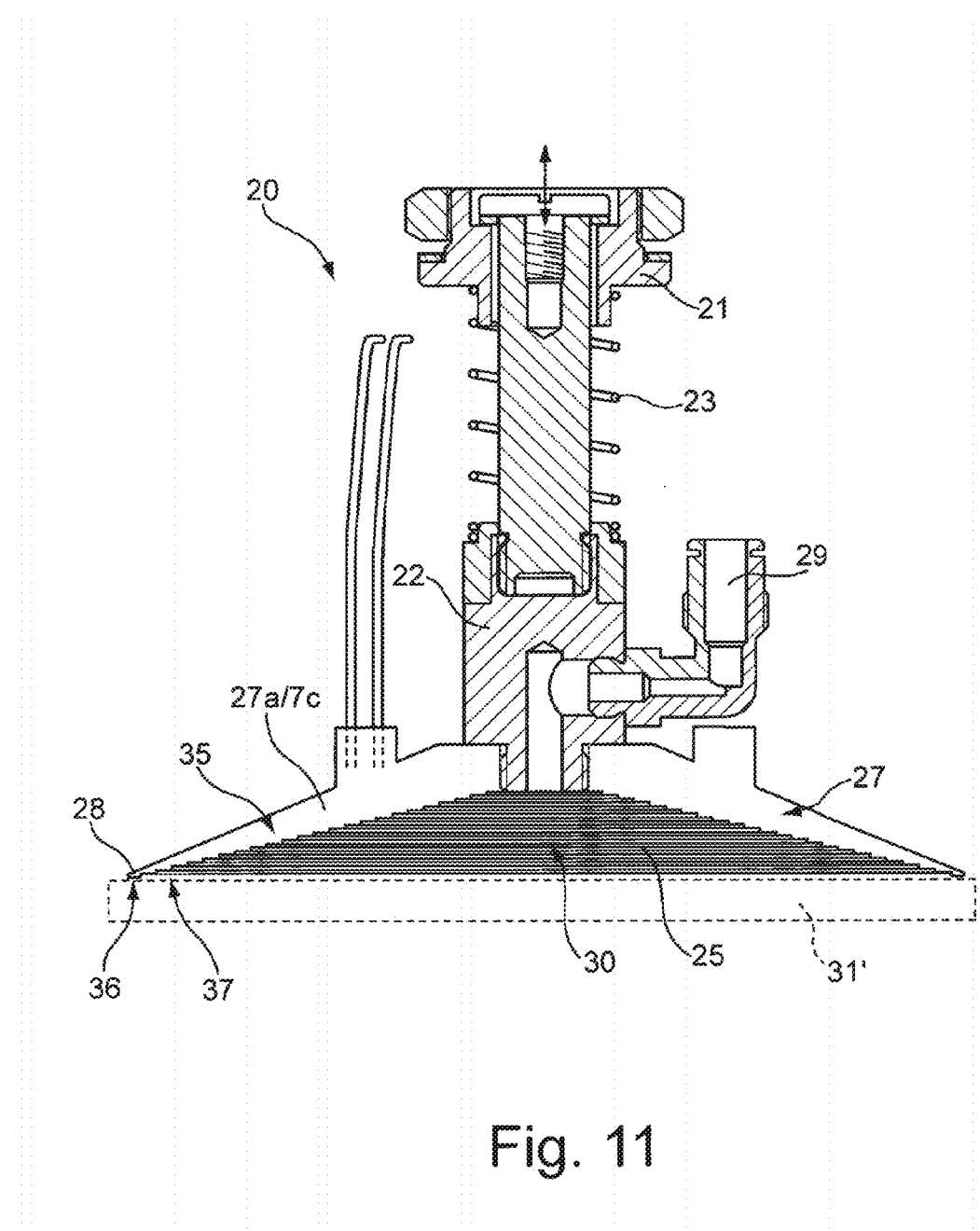
FIG. 11 is a schematic cross-section through an electroadhesion gripper with an additional suction gripper function, with a cone-outer-like electroadhesion face.

FIG. 11 shows another embodiment of an electroadhesion gripper 20. This is provided, similarly to the embodiment of FIG. 9, with a gripper base 21 on which a gripper head 22 which can be displaced counter to a spring 23 is supported.

That electroadhesion gripper 20 also has an additional suction gripper 27 (hybrid gripper), but the suction member 27a thereof is formed in a substantially cone-outer-like manner (or in a bell-like manner) in particular at the workpiece-facing inner side 35 thereof. The electrode arrangement 25 of the electroadhesion gripper 20 is fitted so as to abut that inner side 35, the electrode arrangement 25 here having helically extending electrodes. The suction member 27a or the inner side 35 thereof thus acts as a carrier 7c for the electrodes. The edge of the suction member 27a forms a peripheral sealing lip 28.

When the suction chamber 30 is evacuated, a workpiece 31' is drawn upwards, with the suction member 27a expanding resiliently. The radially outer portion 37 of the electrode arrangement 25 or the electrodes (which portion directly adjoins the region 36 of the sealing lip 28 which faces the workpiece 31') is thereby pressed against the workpiece 31' and can thus support the sealing action of the sealing lip 28 by electroadhesion.

Figure 12A:
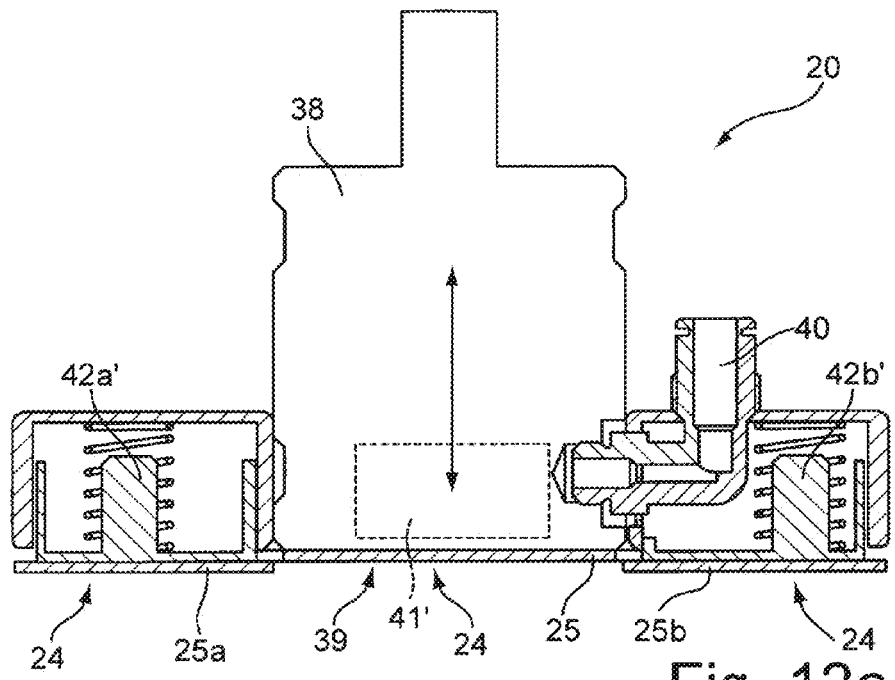
FIG. 12a is a schematic cross-section through an electroadhesion gripper with an additional magnetic gripper function, in a basic state.

FIG. 12a shows another embodiment of an electroadhesion gripper 20. That electroadhesion gripper 20 has an additional magnetic gripper 38 (hybrid gripper) so that the two gripping functions thereof can support or supplement each other.

The magnetic gripper 38 is provided with a permanent magnet 41' (indicated with broken lines) which can be displaced vertically via a pneumatic unit (cf. pneumatic connection piece 40). In a lower position of the permanent magnet 41' (which is shown in FIG. 12*a*), the magnetic gripper 38 is activated and ferromagnetic workpieces can be attracted to or retained on the gripping face 39 at the lower side of the magnetic gripper. In the case of a permanent magnet 41' which has been moved upwards, only a small magnetic field strength is present in the region of the gripping face 39, with a negligible retention action, so that the magnetic gripper 38 is then deactivated.

There is formed at the lower side of the magnetic gripper 38 a first electrode arrangement 25, with which an electroadhesion function can be used. Furthermore, additional electrode arrangements 25*a*, 25*b* are formed on individually resiliently supported holders 42*a*', 42*b*' and can also be used for an electroadhesion function; in the embodiment shown, there are provided a total of four holders 42*a*', 42*b*' having electrode arrangements 25*a*, 25*b* which are arranged annularly around the magnetic gripper 38 (cf. in this regard FIG. 12*c*). All the electrode arrangements 25, 25*a*, 25*b* together form the gripping face 24 of the electroadhesion gripper 20, the gripping face 39 of the magnetic gripper 38 and the portion of the gripping face 24 of the electroadhesion gripper 20, which portion is formed by the electrode arrangement 25, coinciding, and the portions of the gripping face 24, which portions are formed by the annularly surrounding electrode arrangements 25*a*, 25*b*, adjoining the gripping face 39 of the magnetic gripper 38.

Figure 12B:
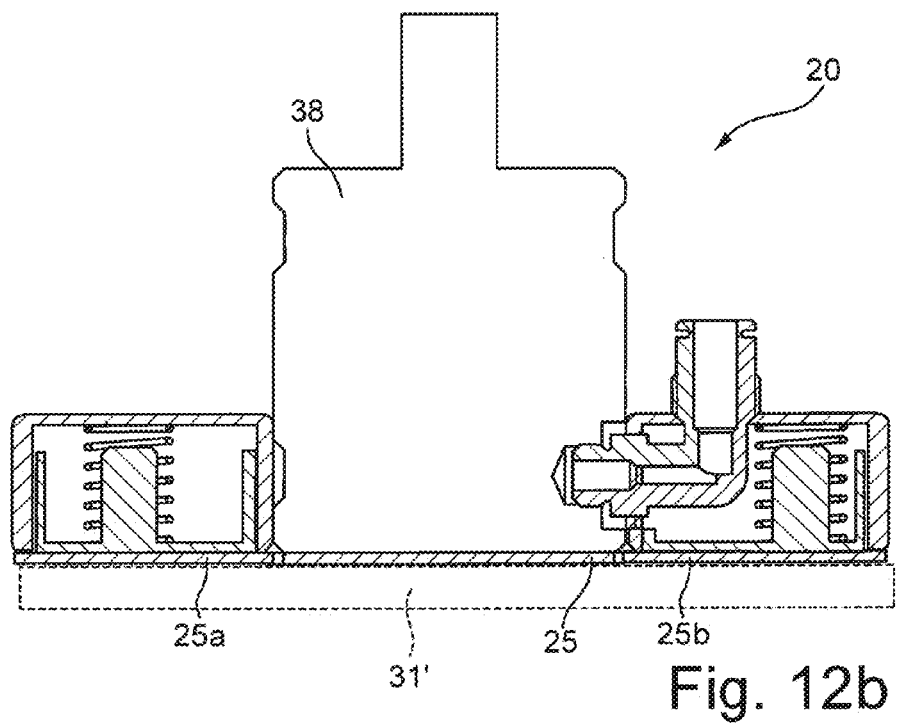
FIG. 12b shows the electroadhesion gripper of FIG. 12a with a workpiece being gripped.

The outer electrode arrangements 25*a*, 25*b* protrude slightly relative to the electrode arrangement 25 and are movable vertically relative to the electrode arrangement 25; a perceptible play with respect to tilting also preferably exists. It is thereby possible, where applicable, to compensate for occurrences of curvature or steps at the surface of a gripped workpiece 31'. FIG. 12*b* shows the state of the electroadhesion gripper 20 of FIG. 12*a* with a gripped planar workpiece 31'. In this instance, the electrode arrangements 25*a*, 25*b* are moved or pressed to the same height as the electrode arrangement 25.

Figure 12C:
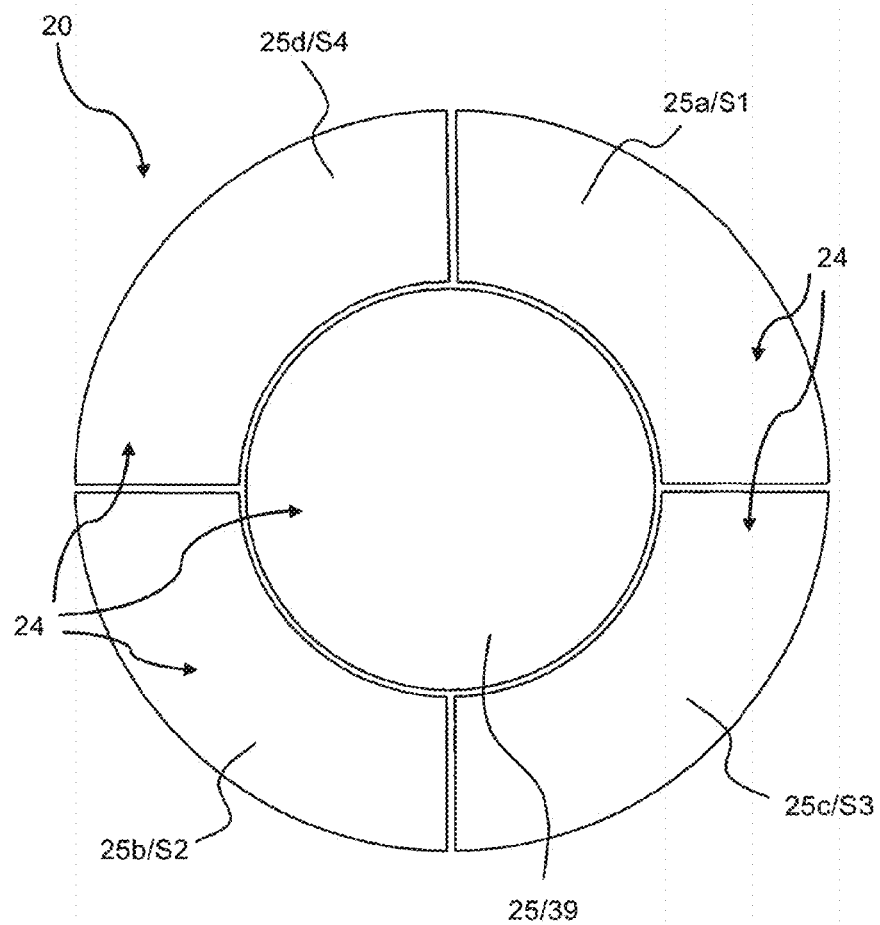

FIG. 12*c* is a view of the lower side of the electroadhesion gripper 20 from FIG. 12*a*. The electrode arrangement 25 (whose extent also corresponds to the gripping face 39 of the magnetic gripper) is annularly surrounded by the electrode arrangements 25*a*-25*d*. All the electrode arrangements 25, 25*a*-25*d* together define the gripping face 24 of the electroadhesion gripper 20. The annular portion of the gripping face 24 is subdivided by the electrode arrangements 25*a*-25*d* into four zones S1-S4 which can be moved individually via four holders (cf. FIG. 12*a*).

In conclusion, in the electroadhesion gripper described above, a gripping function and an occupation examination function can readily be provided by two electrodes connected via a diode, with only two electrical supply lines being required. The operational reliability of the workpiece handling by the electroadhesion gripper can be increased by means of the examination of occupation. The electroadhesion gripper can readily be combined (including afterwards) with other gripper concepts (hybrid grippers), in particular with a suction gripper or a magnetic gripper; a particularly high retention force can thereby be provided.

A number of embodiments of the invention have been described. Nevertheless, it will be understood that various modifications may be made without departing from the spirit and scope of the invention. Accordingly, other embodiments are within the scope of the following claims.

What is claimed is:

1. A workpiece retention electroadhesion gripper, comprising:
    a first spiral electrode having a plurality of turns and a second spiral electrode having a plurality of turns, the first and second spiral electrodes being arranged so as to be at least partially bifilar; and
    a diode by which the first and second spiral electrodes are connected to each other;
    wherein portions of the first and second spiral electrodes are connected in series by the diode, and wherein an entirety of the connected portions of the first and second spiral electrodes has a perceptible inductivity.

2. The electroadhesion gripper of claim 1, wherein the diode connects two directly neighboring portions of the first and second spiral electrodes.

3. The electroadhesion gripper of claim 2, wherein the diode connects an nth turn of one of the spiral electrodes when counting from an outer side of the one spiral electrode to an (n+1)th turn of the other of the spiral electrodes when counting from an outer side of the other electrode, n being a positive integer.

4. The electroadhesion gripper of claim 3, wherein n is 1.

5. The electroadhesion gripper of claim 2, wherein the first and second spiral electrodes have respective voltage connections, and
    wherein the first and second spiral electrodes are connected via the diode at electrode ends remote from the voltage connections.

6. The electroadhesion gripper of claim 5, wherein the first and second spiral electrodes are connected via the diode at inner ends of the first and second spiral electrodes.

7. The electroadhesion gripper of claim 1, wherein at least one of the first and second spiral electrodes is connected to the diode at a point spaced from an electrode end remote from a voltage connection.

8. The electroadhesion gripper of claim 1, wherein the number of turns of each of the first and second spiral electrodes connected to each other in series by the diode are unequal.

9. The electroadhesion gripper of claim 1, wherein the electrodes have a radial spacing that remains constant as a function of a spiral radius over portions where the first and second spiral electrodes are arranged in a bifilar manner.

10. The electroadhesion gripper of claim 1, wherein the electrodes have a radial spacing that varies as a function of a spiral radius over portions where the first and second spiral electrodes are arranged in a bifilar manner.

11. The electroadhesion gripper of claim 1, wherein the first spiral electrode is disposed at least substantially in a first plane and the second spiral electrode extends at least substantially in a second plane, and
    wherein the first and second planes either coincide or are arranged parallel with a maximum spacing of 3.0 mm.

12. The electroadhesion gripper of claim 1, wherein the first and second spiral electrodes extend helically about a substantially conical or bell-shaped carrier.

13. The electroadhesion gripper of claim 1, wherein the first and second spiral electrodes and the diode are arranged on a self-adhesive film bonded on a workpiece-facing side of the gripper.

14. The electroadhesion gripper of claim 1, wherein the first and second spiral electrodes are covered by an insulation layer on a workpiece-facing side of the gripper.

15. The electroadhesion gripper of claim 14, further comprising a wear layer on a workpiece-facing side of the insulation layer, the wear layer comprising a graphite-containing plastic material or a plastic material containing metal particles.

16. The electroadhesion gripper of claim 1 in combination with a suction gripper defining a suction chamber delimited by a suction member and a sealing lip,
wherein a gripping face of the electroadhesion gripper and a gripping face of the suction gripper at least partially overlap or abut each other.

17. The electroadhesion gripper of claim 16, wherein at least a portion of the first and second spiral electrodes is constructed in a workpiece-facing region of the sealing lip or directly adjacent to the workpiece-facing region of the sealing lip.

18. The electroadhesion gripper of claim 16, wherein at least a portion of the first and second spiral electrodes and the diode are integrated in a workpiece-facing side of the suction member.

19. The electroadhesion gripper of claim 1 in combination with a magnetic gripper,
wherein a gripping face of the electroadhesion gripper and a gripping face of the magnetic gripper at least partially overlap or adjoin each other.

20. The electroadhesion gripper of claim 19, wherein at least a portion of the gripping face of the electroadhesion gripper is arranged annularly around the gripping face of the magnetic gripper.

21. The electroadhesion gripper of claim 20, wherein the portion of the gripping face of the electroadhesion gripper arranged annularly around the gripping face of the magnetic gripper is resiliently supported.

22. The electroadhesion gripper of claim 21, wherein the portion of the gripping face of the electroadhesion gripper arranged annularly around the gripping face of the magnetic gripper is pretensioned into a position in which such portion protrudes relative to the gripping face of the magnetic gripper.

23. The electroadhesion gripper of claim 22, wherein such portion is subdivided into individually movable, resiliently supported zones.

24. The electroadhension gripper of claim 1 comprising a plurality of diodes including the diode, wherein the plurality of diodes are connected in series, the first and second spiral electrodes are connected to each other by the plurality of diodes, and the portions of the first and second spiral electrodes are connected in series by the plurality of diodes.

25. A method of operating a workpiece retention electroadhesion gripper, comprising:
supporting a workpiece on a gripping face of the electroadhension gripper of claim 1; and
applying an alternating-current voltage between the first and second spiral electrodes of the electroadhension gripper to grip and retain the workpiece.

26. The method of claim 25, wherein the alternating-current voltage has an amplitude in a range between 1 kV and 20 kV and a frequency in a range between 500 Hz and 20 kHz.

27. The method of claim 25, wherein the alternating-current voltage is applied with a plurality of successive half-waves of voltage having an equal, first polarity, the diode blocking at the first polarity.

28. The method of claim 25, further comprising determining an occupation of the electroadhesion gripper during one or more successive half-waves of the alternating-current voltage having a second polarity at which the diode is conductive.

29. The method of claim 25, further comprising determining a wear degree of the electroadhesion gripper during one or more successive half-waves of the alternating-current voltage having a second polarity at which the diode component is conductive.

30. The method of claim 25, further comprising switching off the alternating-current voltage between the first and second spiral electrodes, and then blowing the workpiece off the electroadhesion gripper.

\* \* \* \* \*

UNITED STATES PATENT AND TRADEMARK OFFICE
CERTIFICATE OF CORRECTION

PATENT NO. : 9,704,734 B2
APPLICATION NO. : 14/597521
DATED : July 11, 2017
INVENTOR(S) : Walter Thiel and Alexander Heinz It is certified that error appears in the above-identified patent and that said Letters Patent is hereby corrected as shown below:

In the Claims

Column 18
Line 4, in Claim 24, delete "electroadhension" and insert -- electroadhesion --
Lines 12-13 (Approx.), in Claim 25, delete "electroadhension" and insert -- electroadhesion --
Line 15 (Approx.), in Claim 25, delete "electroadhension" and insert -- electroadhesion --

Signed and Sealed this
Eleventh Day of February, 2020

Andrei Iancu
*Director of the United States Patent and Trademark Office*